United States Patent
Jen et al.

(10) Patent No.: US 9,704,895 B2
(45) Date of Patent: Jul. 11, 2017

(54) DISPLAY DEVICE AND METHOD FOR MANUFACTURING THE SAME

(71) Applicants: HannStar Display (Nanjing) Corporation, Nanjing (CN); HannStar Display Corporation, Taipei (TW)

(72) Inventors: Tean-Sen Jen, Taoyuan (TW); Sung-Chun Lin, Tainan (TW); Hsuan-Chen Liu, Kaohsiung (TW); Chien-Ting Chan, Tainan (TW)

(73) Assignees: HannStar Display (Nanjing) Corporation, Nanjing (CN); HannStar Display Corporation, Taipei (CN)

( * ) Notice: Subject to any disclaimer, the term of this patent is extended or adjusted under 35 U.S.C. 154(b) by 0 days.

(21) Appl. No.: 15/088,047

(22) Filed: Mar. 31, 2016

(65) Prior Publication Data
US 2016/0293645 A1  Oct. 6, 2016

(30) Foreign Application Priority Data
Apr. 2, 2015  (CN) .......................... 2015 1 0154173

(51) Int. Cl.
| H01L 29/12 | (2006.01) |
|---|---|
| H01L 27/12 | (2006.01) |
| G02F 1/1339 | (2006.01) |
| G02F 1/1335 | (2006.01) |
| G02F 1/1345 | (2006.01) |
| G02F 1/1343 | (2006.01) |

(52) U.S. Cl.
CPC ........ *H01L 27/1255* (2013.01); *G02F 1/1339* (2013.01); *G02F 1/13454* (2013.01); *G02F 1/133512* (2013.01); *H01L 27/1262* (2013.01); *G02F 1/13439* (2013.01)

(58) Field of Classification Search
CPC .................................................. H01L 27/1255
USPC ............................................................ 257/71
See application file for complete search history.

(56) References Cited

U.S. PATENT DOCUMENTS

| 2004/0070700 A1* | 4/2004 | Sah ........................ G02F 1/1309 349/54 |
|---|---|---|
| 2014/0291803 A1* | 10/2014 | Lin .......................... H01L 28/60 257/532 |

* cited by examiner

*Primary Examiner* — Jami M Valentine
(74) *Attorney, Agent, or Firm* — CKC & Partners Co., Ltd.

(57) ABSTRACT

A display device and a method for manufacturing the same are provided. The display device includes a first substrate, a second substrate and a light curable sealant. The first substrate has a displaying area and a non-displaying area, in which the displaying area includes a pixel array, and the non-displaying area includes a driving circuit. The driving circuit includes at least a capacitor which is made of transparent conductive material. The second substrate has an opaque area. The light curable sealant is located between the first substrate and the second substrate. When viewing from a normal vector of the first substrate or the second substrate, the light curable sealant, the capacitor and the opaque area are at least partially overlapped with each other.

5 Claims, 4 Drawing Sheets

DISPLAY DEVICE AND METHOD FOR MANUFACTURING THE SAME

RELATED APPLICATIONS

This application claims priority to China Application Serial Number 201510154173.3 filed Apr. 2, 2015, which is herein incorporated by reference.

BACKGROUND

Field of Invention

The present invention relates to a display device. More particularly, the present invention relates to the display device and a method for manufacturing the display device in which a driving circuit is disposed on a lower substrate.

Description of Related Art

Generally, a display device is mainly composed of an upper substrate, a lower substrate, a backlight module, an optical film, and a gate driving circuit and a data driving circuit for driving a pixel. With the technology evolution, the data driving circuit may be formed on the lower substrate to improve production efficiency and fulfill the requirement of narrowing borders. However, the gate driving circuit formed on the lower substrate is overlapped with a sealant disposed between the two substrates when the sealant is being cured with light, and thus the gate driving circuit would block the light and the sealant may not be cured completely. As a result, moisture would be generated from the sealant, and may corrode the gate driving circuit and cause malfunction thereof, and accordingly the reliability and the usage duration of the display device may be reduced. Therefore, improvement of the above-mentioned structure of the display device is an issue to be solved.

SUMMARY

An aspect of embodiments of the present invention provides a display device which includes a first substrate, a second substrate and a light curable sealant. The first substrate has a displaying area and a non-displaying area. The displaying area includes a pixel array. The non-displaying area includes a driving circuit. The driving circuit includes at least a capacitor which is made of a transparent conductive material. The second substrate has an opaque area. The light curable sealant is disposed between the first substrate and the second substrate. The light curable sealant, the capacitor and the opaque area are at least partially overlapped with each other when viewing from a normal vector of the first substrate or the second substrate.

In some embodiments, the transparent conductive material includes indium tin oxide (ITO), indium zinc oxide (IZO), indium oxide or zinc oxide.

In some embodiments, the driving circuit is a gate driver including a transistor. The capacitor has a first terminal coupled to a gate of the transistor, and a second terminal coupled to a source or a drain of the transistor. In some embodiments, the first terminal of the capacitor is coupled to the source or the drain of the transistor, and the second terminal is configured to receive a signal.

In some embodiments, the pixel array includes a pixel structure. The pixel structure includes a pixel electrode and a common electrode. Material of the pixel electrode is the same with material of the first terminal of the capacitor, and material of the common electrode is the same with material of the second terminal of the capacitor.

Embodiments of the present invention provide a method for manufacturing a display device. The method includes: providing a first substrate which has a displaying area and a non-displaying area; forming a pixel array in the displaying area of the first substrate; forming a driving circuit in the non-displaying area of the first substrate, in which the driving circuit includes at least a capacitor which is made of a transparent conductive material; disposing a light curable sealant in the non-displaying area of the first substrate; covering the first substrate with a second substrate, in which the second substrate has an opaque area, and the light curable sealant, the capacitor and the opaque area are at least partially overlapped with each other when viewing from a normal vector of the first substrate or the second substrate; and emitting light from a side of the first substrate, in which the light is configured to penetrate the first substrate and the capacitor for curing the light curable sealant.

In some embodiments, a procedure of forming the pixel array and the driving circuit includes: forming a first patterned metal layer on the first substrate, in which the first patterned metal layer includes a gate in the displaying area; forming an insulating layer on the gate; forming a first patterned transparent conductive layer on the insulating layer, in which the first patterned transparent conductive layer includes a pixel electrode in the displaying area and a first terminal of the capacitor; forming a patterned semiconductor layer on the insulating layer; forming a second patterned metal layer on the insulating layer, in which the second patterned metal layer extends toward the pixel electrode; forming a patterned protection layer covering the patterned semiconductor layer and the patterned second metal layer, in which the patterned protection layer extends toward the non-displaying area to cover the first patterned transparent conductive layer; and forming a second patterned transparent conductive layer on the patterned protection layer, in which the second patterned transparent conductive layer includes a common electrode in the displaying area and a second terminal of the capacitor.

In summary, the driving circuit has at least a capacitor made of transparent conductive material, and therefore the light can penetrate the capacitor to cure the light curable sealant in the display device and method provided by the embodiments. It prevents the driving circuit of the display device from being damaged from the moisture, and thus the reliability and the utility of the display device can be increased.

BRIEF DESCRIPTION OF THE DRAWINGS

The above and other aspects, features and advantages of the present invention will become more apparent upon consideration of the following description of preferred embodiments taken in conjunction with the accompanying drawing figures.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", etc. in the specification should be understood for identifying units or parts described by the same terminology, but are not referred to particular order or sequence. In other words, terms "first" and "second" can be switched in some embodiments. Moreover, the drawings are just schematic, and additional layers may be formed between any two layers based on the practical requirement.

Figure 1:
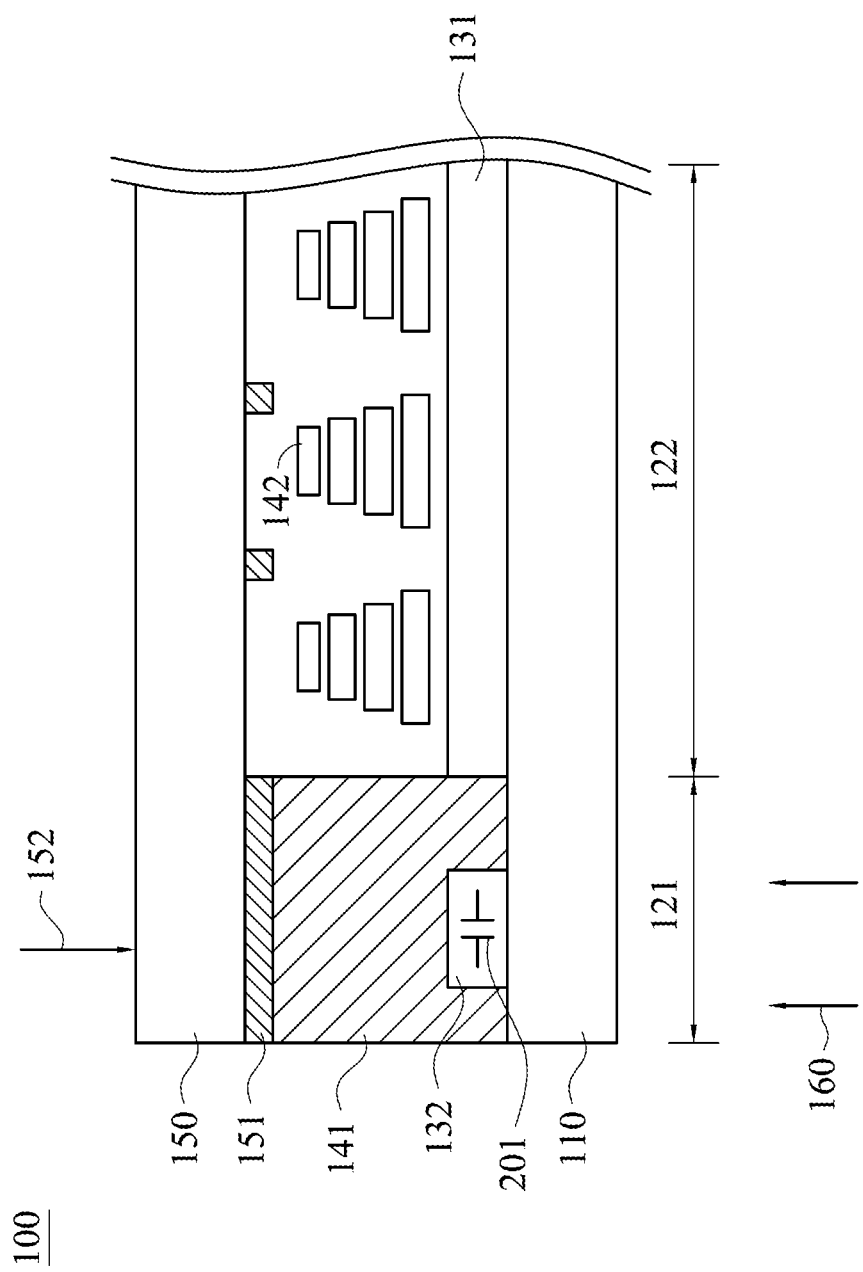
FIG. 1 is a diagram illustrating a cross-sectional view of a display device according to an embodiment.

FIG. 1 is a diagram illustrating a cross-sectional view of a display device according to an embodiment. Referring to FIG. 1, a display device 100 includes a first substrate 110 (also referred to a lower substrate), a driving circuit 132, a pixel array 131, a light curable sealant 141, liquid crystal 142, a black matrix 151 and a second substrate 150 (also referred to a upper substrate). For simplification, not all components of the display device 100 are shown in FIG. 1. For example, the display device 100 may further include a backlight module, a color filter, a polarization sheet, etc. In addition, the components in FIG. 1 are not drawn to actual sizes. The display device 100 may be implemented as a variety of display panels such as amorphous silicon (a-Si) display panel, low temperature poly-silicon (LTPS) display panel, IGZO display panel, etc., and the invention is not limited thereto.

The first substrate 110 has a displaying area 122 and a non-displaying area 121. The pixel array 131 is disposed in the displaying area 122, and the driving circuit 132 is disposed in the non-displaying area 121. In the embodiment, the driving circuit 132 includes at least one capacitor 201 which is made of transparent conductive material. The transparent conductive material may include indium tin oxide (ITO), indium zinc oxide (IZO), indium oxide, zinc oxide, or other suitable material. The second substrate 150 has an opaque area such as the black matrix 151. The light curable sealant 141 is disposed in the non-displaying area 121 between the first substrate 110 and the second substrate 150, and the light curable sealant 141 surrounds the liquid crystal 142. In particular, the light curable sealant 141, the capacitor 201 in the driving circuit 132, and the black matrix 151 are at least partially overlapped with each other when viewing from normal vectors (e.g. a normal vector 152) of the first substrate 110 or the second substrate 150. In general, the black matrix 151 is opaque, and hence light is emitted upwards for curing the light curable sealant 141. In the embodiment, the emitted light can penetrate the capacitor 201 because the capacitor 201 is made of the transparent conductive material, and therefore the light curable sealant 141 is cured by adequate irradiation. It prevents the light curable sealant 141 from being cured incompletely. The incomplete irradiation may produce moisture to corrode the driving circuit 132 and cause malfunction of the driving circuit 132.

In some embodiments, a method for manufacturing the display device 100 is described below. First, first substrate 110 is provided, the pixel array 131 is formed in the displaying area 122 on the first substrate 110, and the driving circuit 132 is formed in the non-displaying area 121 on the first substrate 110. Next, the liquid crystal 142 is injected into the displaying area 122, and the light curable sealant 141 is disposed in the non-displaying area 121. Then, the first substrate 110 is covered with the second substrate 150, and light 160 is emitted upwards from a lower side of the first substrate 110 opposite to the second substrate 150. The light 160 is configured to penetrate the first substrate 110 and the capacitor 201 in the driving circuit 132 for curing the light curable sealant 141. In the embodiment, the light curable sealant 141 may be an UV sealant, and the first substrate 110 and/or the second substrate 150 may be glass, other hard material, or a flexible substrate.

The pixel array 131 includes multiple pixel structures. In some embodiments, material of pixel electrodes of the pixel structures are the same with material of a first terminal of the capacitor 201, and material of common electrodes of the pixel structures are the same with that of a second terminal of the capacitor 201. As a result, it just needs one process to form the pixel electrode (or common electrode) and the first terminal (or second terminal) of the capacitor 201 when manufacturing the display device 100.

Figure 2:
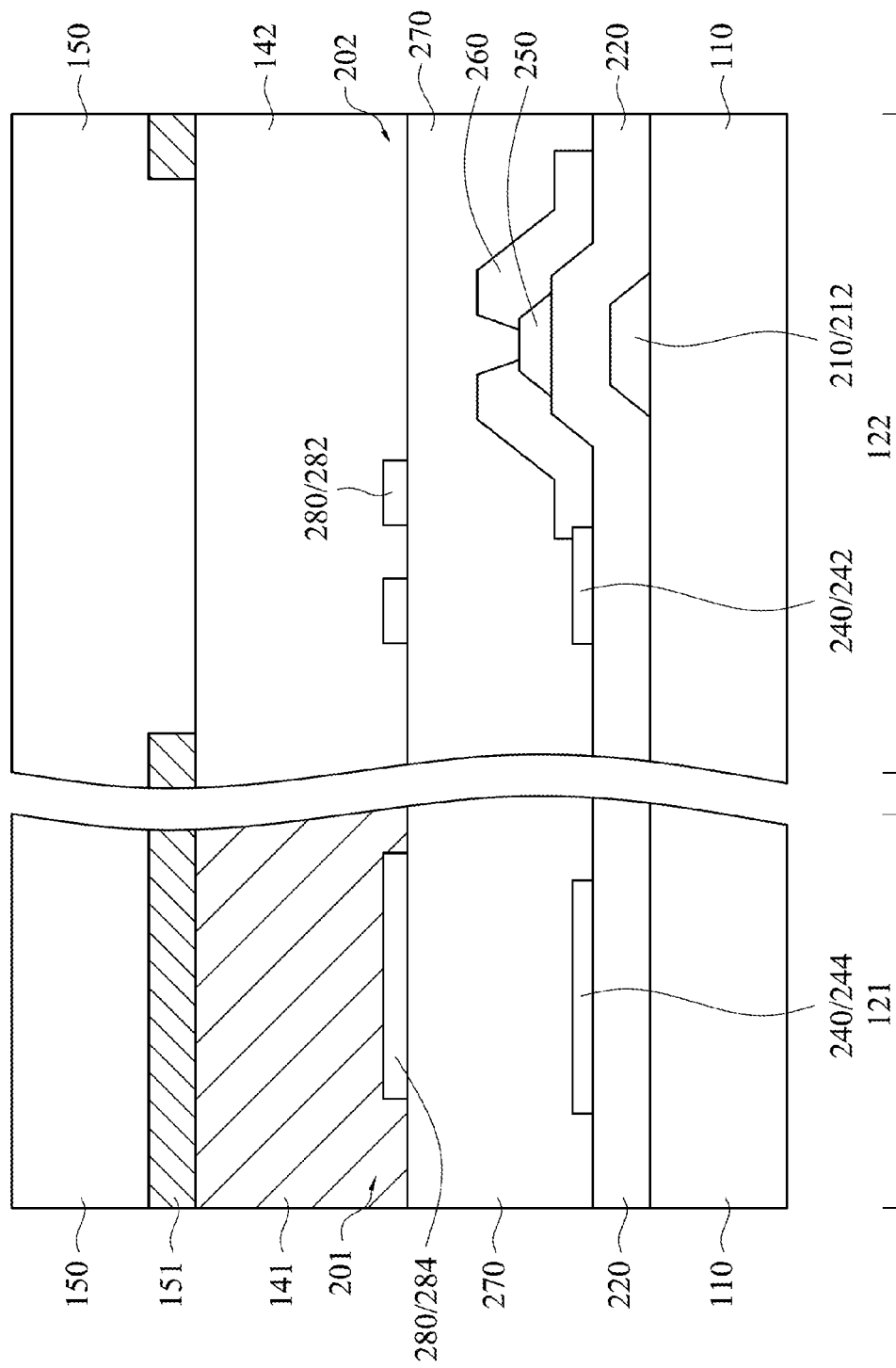
FIG. 2 is a diagram illustrating a cross-sectional view of a capacitor 201 and a pixel structure 202 according to an embodiment.

For example, referring to FIG. 2, FIG. 2 is a diagram illustrating a cross-sectional view of a capacitor 201 and a pixel structure 202 according to an embodiment. Steps of forming the capacitor 201 and the pixel structure 202 are described as follows. First, a first patterned metal layer 210 is formed on the first substrate 110. The first patterned metal layer 210 includes a gate 212 (i.e. the gate of a thin film transistor) in the displaying area 122. Next, an insulating layer 220 is formed to cover the substrate 110 and the gate 212. A first patterned transparent conductive layer 240 is formed on the insulating layer 220. The first patterned transparent conductive layer 240 includes a pixel electrode 242 in the displaying area 122 and a first terminal 244, which is a lower electrode of the capacitor 201, in the non-displaying area 121. Then, a patterned semiconductor layer 250 is formed on the insulating layer 220. The patterned semiconductor layer 250 is taken as a channel of the thin film transistor. Then, a second patterned metal layer 260 is formed on the insulating layer 220 and extends towards the pixel electrode 242. The second patterned metal layer 260 is taken as a source and a drain of the thin film transistor. A patterned protection layer 270 is formed to cover the patterned semiconductor layer 250 and the second patterned metal layer 260. The patterned protection layer 270 extends toward the non-displaying area 121 to cover the first patterned transparent conductive layer 240 (i.e. the first terminal 244). Then, a second patterned transparent conductive layer 280 is formed on the patterned protection layer 270, in which the second patterned transparent conductive layer 280 includes a common electrode 282 in the displaying area 122 and a second terminal 284, which is an upper electrode of the capacitor 201, in the non-displaying area 121.

In another embodiment, The first patterned transparent conductive layer 240 includes a common electrode (not shown) in the displaying area 122 and a lower electrode of the capacitor 201 in the non-displaying area 121, and the second patterned transparent conductive layer 280 includes a pixel electrode (not shown) in the displaying area 122 and an upper electrode of the capacitor 201 in the non-displaying area 121.

Herein, material of the first patterned transparent conductive layer 240 and the second patterned transparent conductive layer 280 includes ITO, IZO, indium oxide, zinc oxide or other suitable material. In other words, the first terminal 244 and the second terminal 284 are two terminals of the capacitor 201. In some embodiments, material of the first patterned metal layer 210 and/or the second patterned metal layer 260 may include copper, aluminum, tungsten, metal alloys, metal silicide or other similar material. The insulating layer 220 may include silicon material such as silicon oxide or SiNx. In addition, the patterned semiconductor layer 250 may include material such as amorphous silicon, polycrystalline silicon or indium gallium zinc oxide (IGZO). Material of the patterned protection layer 270 may include dielectric material such as SiNx. Note that the first terminal 244 of the capacitor 201 and the pixel electrode 242 are made with the same material and in the same process in the embodiment, and therefore there is a process advantage.

In some embodiments, the driving circuit 132 is a gate driving circuit (also referred to a gate driver). There are several parasitic capacitance problems in the gate driver, and hence we need additional capacitors to compensate the parasitic capacitance. Alternatively, the additional capacitors may have discharge functions or other functions. In some embodiments, if the gate driving circuit needs at least a capacitor with large capacitance, then the capacitor may be made of the transparent conductive material, but the invention is not limited thereto.

Figure 3:
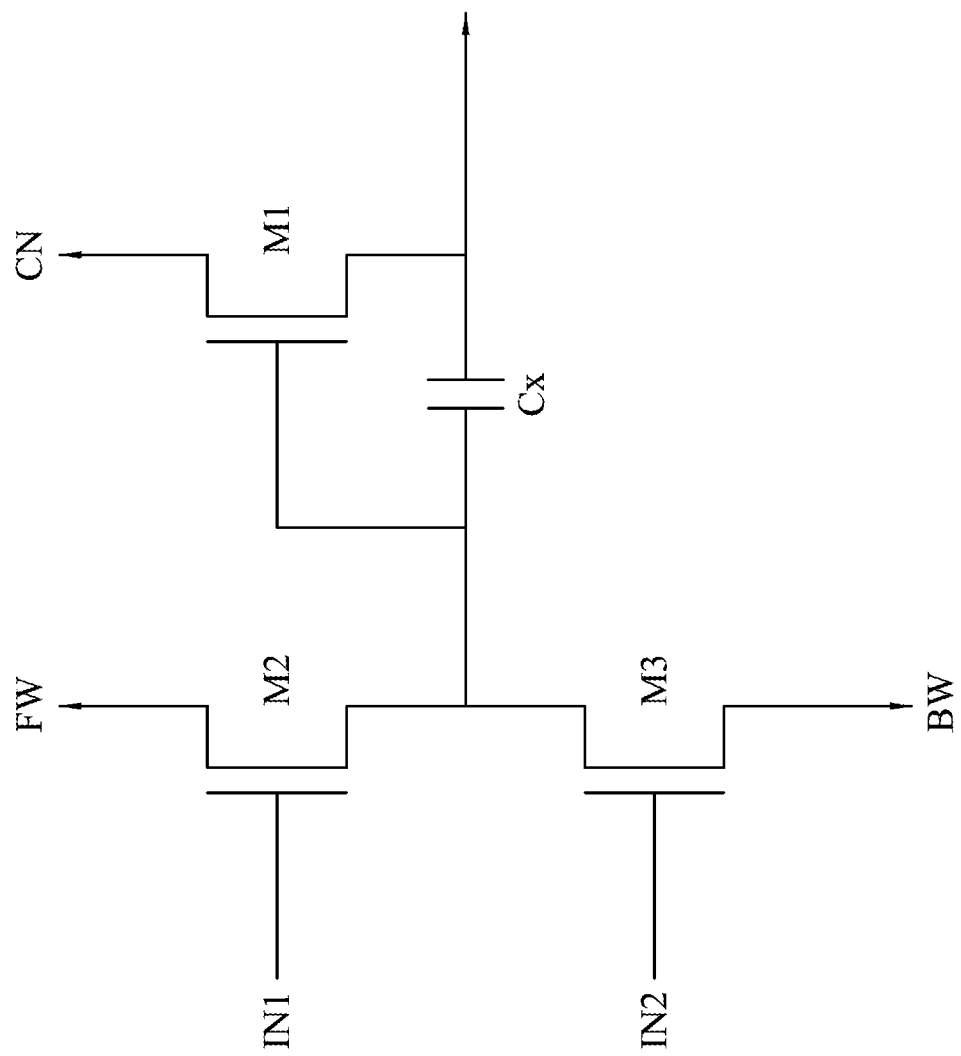
FIG. 3 is a diagram illustrating part of the gate driving circuit according to an embodiment.

For example, in some embodiments, the first terminal of the capacitor 201 is coupled to a gate of a transistor, and the second terminal of the capacitor 201 is coupled to a source or a drain of the transistor. Referring to FIG. 3, FIG. 3 is a diagram illustrating part of the gate driving circuit according to an embodiment. Part of a shift register is shown in FIG. 3, and the circuit has a first transistor M1, a second transistor M2, a third transistor M3 and a capacitor Cx. A gate of the transistor M2 receives an input signal IN1, a drain of the transistor M2 receives a forward voltage from a previous stage of the shift register. A source of the transistor M3 is coupled to a source of the transistor M2, a gate of the transistor M3 receives an input signal IN2, and a drain of the transistor M3 receives a backward voltage from a next stage of the shift register. A first terminal of the capacitor Cx is coupled to a gate of the transistor M1, and a second terminal of the capacitor Cx is coupled to the source of the transistor M1. A drain of the transistor M1 is coupled to a clock signal CN. In the embodiment, the capacitor Cx is made of the transparent conductive material.

Figure 4:
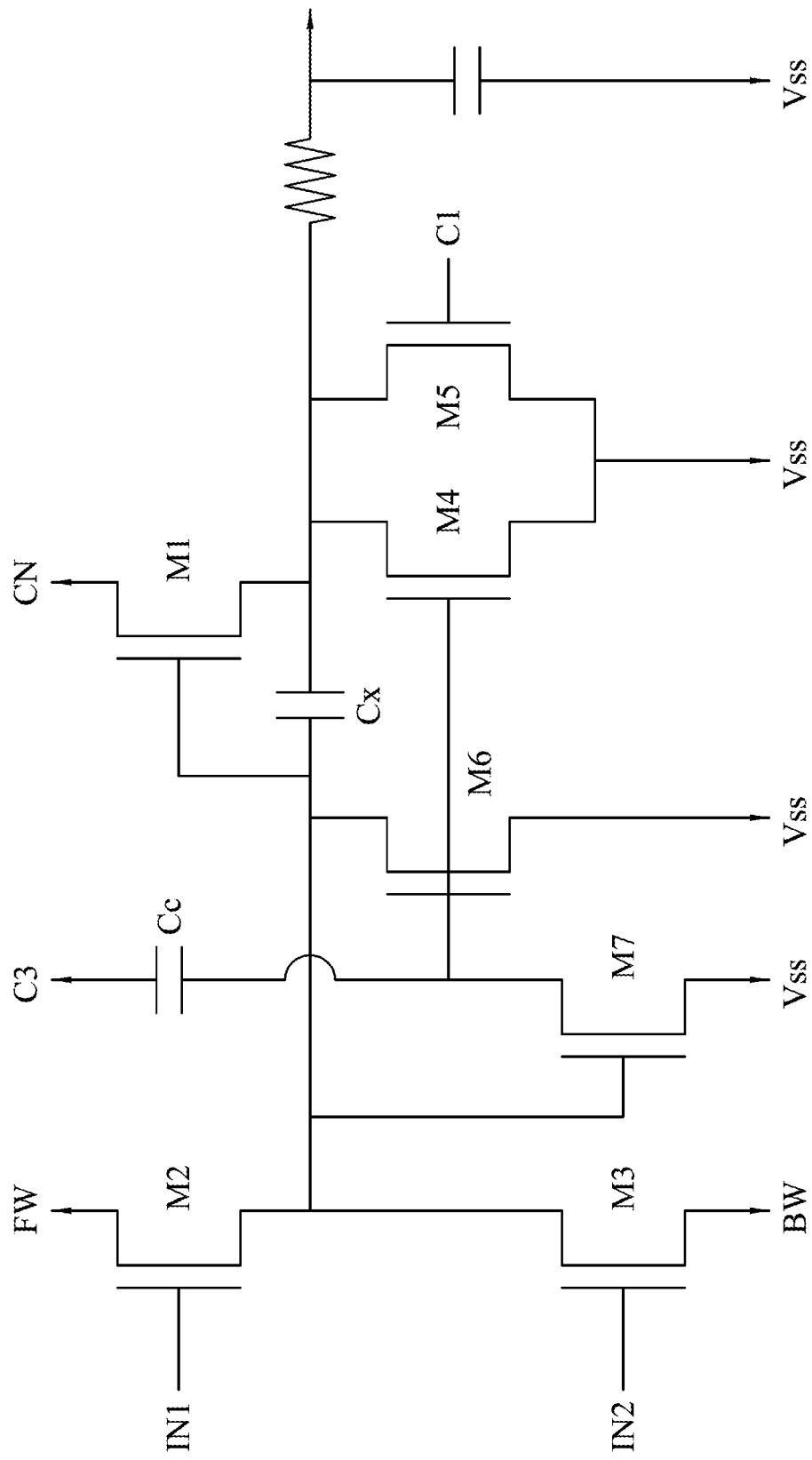
FIG. 4 is a diagram illustrating part of the gate driving circuit according to an embodiment.

In some embodiments, the first terminal of the capacitor made of the transparent conductive material is coupled to a source or a drain of a transistor, and the second terminal thereof is configured to receive a signal. For example, referring to FIG. 4, FIG. 4 is a diagram illustrating part of the gate driving circuit according to an embodiment. Not like the embodiment of FIG. 3, the shift register in FIG. 4 further includes transistors M4-M7. A first terminal of a capacitor Cc is coupled to a source of the transistor M7, and a second terminal of the capacitor Cc is coupled to a clock signal C3. A gate of the transistor M5 is coupled to a clock signal C1. Not all couple relationships in FIG. 4 are described herein. In the embodiment of FIG. 4, the capacitors Cx and Cc are made of the transparent conductive material. It is worth mentioning that the circuits in FIG. 3 and FIG. 4 are just examples, and which capacitor in the gate driving circuit is made of the transparent conductive material is not limited in the invention.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
    a first substrate having a displaying area and a non-displaying area, wherein the displaying area comprises a pixel array, and the non-displaying area comprises a driving circuit, and the driving circuit comprises at least a capacitor which is made of transparent conductive material;
    a second substrate having an opaque area; and
    a light curable sealant disposed between the first substrate and the second substrate,
    wherein the light curable sealant, the capacitor and the opaque area are at least partially overlapped with each other when viewing from a normal vector of the first substrate or the second substrate.

2. The display device of claim 1, wherein the transparent conductive material comprises indium tin oxide (ITO), indium zinc oxide (IZO), indium oxide or zinc oxide.

3. The display device of claim 1, wherein the driving circuit is a gate driver comprising at least a transistor, and the capacitor has a first terminal coupled to a gate of the transistor, and a second terminal coupled to a source or a drain of the transistor.

4. The display device of claim 1, wherein the driving circuit is a gate driver comprising at least a transistor, and the capacitor has a first terminal coupled to a source or a drain of the transistor, and a second terminal configured to receive a signal.

5. The display device of claim 1, wherein the pixel array comprises a pixel structure, and the pixel structure comprises a pixel electrode and a common electrode, and material of the pixel electrode is the same with material of a first terminal of the capacitor, material of the common electrode is the same with material of a second terminal of the capacitor.

* * * * *